United States Patent
Chan et al.

(10) Patent No.: US 8,295,792 B2
(45) Date of Patent: *Oct. 23, 2012

(54) CONTROL OF SWITCHER REGULATED POWER AMPLIFIER MODULES

(75) Inventors: Wen-Yen Chan, Waterloo (CA); Nasserullah Khan, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/351,328

(22) Filed: Jan. 17, 2012

(65) Prior Publication Data
US 2012/0122411 A1 May 17, 2012

Related U.S. Application Data

(63) Continuation of application No. 12/784,971, filed on May 21, 2010, now Pat. No. 8,160,517, which is a continuation of application No. 11/763,068, filed on Jun. 14, 2007, now Pat. No. 7,907,920.

(60) Provisional application No. 60/813,352, filed on Jun. 14, 2006.

(51) Int. Cl.
*H01Q 11/12* (2006.01)
*H04B 1/04* (2006.01)

(52) U.S. Cl. .................... 455/126; 455/127.2; 455/127.5

(58) Field of Classification Search .............. 455/127.1, 455/127.2, 127.3, 127.5, 126; 323/282; 330/278, 330/285, 296, 297, 127
See application file for complete search history.

(56) References Cited

U.S. PATENT DOCUMENTS

| | | |
|---|---|---|
| 3,486,128 A | 12/1969 | Lohrmann |
| 4,453,264 A | 6/1984 | Hochstein |
| 4,809,339 A | 2/1989 | Shih et al. |
| 4,849,711 A | 7/1989 | Leis et al. |
| 5,267,262 A | 11/1993 | Wheatley, III |
| 5,452,473 A | 9/1995 | Weiland et al. |
| 5,467,058 A | 11/1995 | Fujita |
| 5,485,486 A | 1/1996 | Gilhousen et al. |
| 5,732,334 A | 3/1998 | Miyake |
| 5,852,630 A | 12/1998 | Langberg et al. |
| 6,043,707 A | 3/2000 | Budnik |
| 6,064,269 A | 5/2000 | Ruppel et al. |
| 6,107,878 A | 8/2000 | Black |

(Continued)

FOREIGN PATENT DOCUMENTS

AU  2007260547 A1  12/2007

(Continued)

OTHER PUBLICATIONS

United States Ex Parte Quayle Action dated Aug. 3, 2011, U.S. Appl. No. 12/942,757.

(Continued)

*Primary Examiner* — Nguyen Vo
(74) *Attorney, Agent, or Firm* — Bereskin & Parr LLP/S.E.N.C.R.L., s.r.l.

(57) ABSTRACT

Various embodiments described herein relate to a power management block and an amplification block used in the transmitter of a communication subsystem. The power management block provides improved control for the gain control signal provided to a pre-amplifier and the supply voltage provided to a power amplifier which are both in the amplification block. The power expended by the power amplifier is optimized by employing a continuous control method in which one or more feedback loops are employed to take into account various characteristics of the transmitter components and control values.

21 Claims, 5 Drawing Sheets

U.S. PATENT DOCUMENTS

| | | | |
|---|---|---|---|
| 6,137,840 A | 10/2000 | Tiedemann, Jr. et al. |
| 6,166,598 A | 12/2000 | Schlueter |
| 6,178,313 B1 | 1/2001 | Mages et al. |
| 6,205,127 B1 | 3/2001 | Ramesh |
| 6,208,202 B1 | 3/2001 | Kaufman et al. |
| 6,265,935 B1 | 7/2001 | Kaneda et al. |
| 6,313,698 B1 | 11/2001 | Zhang et al. |
| 6,359,504 B1 | 3/2002 | Cozzarelli |
| 6,373,823 B1 | 4/2002 | Chen et al. |
| 6,421,327 B1 | 7/2002 | Lundby et al. |
| 6,445,247 B1 | 9/2002 | Walker |
| 6,525,605 B2 | 2/2003 | Hu et al. |
| 6,531,860 B1 | 3/2003 | Zhou et al. |
| 6,535,066 B1 | 3/2003 | Petsko |
| 6,566,944 B1 | 5/2003 | Pehlke et al. |
| 6,597,925 B1 | 7/2003 | Garcia et al. |
| 6,765,440 B2 | 7/2004 | Chandrasekaran |
| 6,862,457 B1 | 3/2005 | Sarkar et al. |
| 6,871,050 B2 | 3/2005 | Wahl |
| 6,876,697 B2 | 4/2005 | Peters et al. |
| 6,914,487 B1 | 7/2005 | Doyle et al. |
| 6,965,676 B1 | 11/2005 | Alfred |
| 7,116,955 B2 | 10/2006 | Schaffer et al. |
| 7,183,856 B2 | 2/2007 | Miki et al. |
| 7,333,563 B2 | 2/2008 | Chan et al. |
| 7,375,540 B2 | 5/2008 | Burns et al. |
| 7,411,896 B1 | 8/2008 | Karsi |
| 7,471,738 B2 | 12/2008 | Chan et al. |
| 7,542,741 B2 | 6/2009 | Rozenblit et al. |
| 7,551,689 B2 | 6/2009 | Chan et al. |
| 7,787,566 B2 | 8/2010 | Chan et al. |
| 7,852,968 B2 | 12/2010 | Chan et al. |
| 7,873,119 B2 | 1/2011 | Chan et al. |
| 7,907,920 B2 | 3/2011 | Chan et al. |
| 8,000,409 B2 | 8/2011 | Chan et al. |
| 8,098,761 B2 | 1/2012 | Chan et al. |
| 8,160,517 B2 | 4/2012 | Chan et al. |
| 2001/0026600 A1 | 10/2001 | Mochizuki et al. |
| 2001/0048292 A1 | 12/2001 | Wahl |
| 2002/0013157 A1 | 1/2002 | Ichikawa |
| 2002/0080887 A1 | 6/2002 | Jeong et al. |
| 2002/0159503 A1 | 10/2002 | Ramachandran |
| 2002/0183028 A1 | 12/2002 | Takahashi et al. |
| 2003/0002452 A1 | 1/2003 | Sahota |
| 2003/0036361 A1 | 2/2003 | Kawai et al. |
| 2003/0060193 A1 | 3/2003 | Kurita |
| 2003/0086398 A1 | 5/2003 | Hiltunen |
| 2003/0176202 A1 | 9/2003 | Bartl et al. |
| 2003/0222819 A1 | 12/2003 | Karr et al. |
| 2004/0100921 A1 | 5/2004 | Khan |
| 2004/0146013 A1 | 7/2004 | Song et al. |
| 2004/0180686 A1 | 9/2004 | Nakayama |
| 2004/0208260 A1 | 10/2004 | Chan et al. |
| 2004/0213335 A1 | 10/2004 | Forest et al. |
| 2004/0251962 A1 | 12/2004 | Rosnell et al. |
| 2005/0122171 A1 | 6/2005 | Miki et al. |
| 2005/0186923 A1 | 8/2005 | Chan et al. |
| 2005/0285681 A1 | 12/2005 | Doherty et al. |
| 2006/0046658 A1 | 3/2006 | Cruz et al. |
| 2006/0046666 A1 | 3/2006 | Hara et al. |
| 2007/0035285 A1 | 2/2007 | Balakrishnan et al. |
| 2007/0139014 A1 | 6/2007 | Girson et al. |
| 2007/0184791 A1 | 8/2007 | Vinayak et al. |
| 2007/0258602 A1 | 11/2007 | Vepsalainen et al. |
| 2007/0291718 A1 | 12/2007 | Chan et al. |
| 2007/0291872 A1 | 12/2007 | Chan et al. |
| 2008/0118001 A1 | 5/2008 | Chan et al. |
| 2009/0021303 A1 | 1/2009 | Vinayak et al. |
| 2009/0074107 A1 | 3/2009 | Chan et al. |
| 2009/0245419 A1 | 10/2009 | Chan et al. |
| 2010/0053533 A1 | 3/2010 | Fan et al. |
| 2010/0227578 A1 | 9/2010 | Chan |
| 2010/0233978 A1 | 9/2010 | Chan et al. |
| 2010/0283626 A1 | 11/2010 | Breed |
| 2010/0291887 A1 | 11/2010 | Chan et al. |
| 2011/0130105 A1 | 6/2011 | Chan et al. |
| 2011/0319124 A1 | 12/2011 | Chan |
| 2012/0021704 A1 | 1/2012 | Chan et al. |
| 2012/0087441 A1 | 4/2012 | Chan et al. |
| 2012/0122411 A1 | 5/2012 | Chan et al. |

FOREIGN PATENT DOCUMENTS

| | | |
|---|---|---|
| AU | 2007260548 | 12/2007 |
| CA | 2506512 | 6/2004 |
| CA | 2497038 | 8/2005 |
| CA | 2616323 C | 12/2007 |
| CA | 2623941 | 12/2007 |
| CA | 2740489 | 11/2011 |
| CN | 1153388 | 10/2001 |
| CN | 1329413 | 1/2002 |
| CN | 1355967 | 6/2002 |
| CN | 1525658 | 9/2004 |
| CN | 101341653 | 11/2010 |
| CN | 1658497 | 7/2011 |
| CN | 101341654 B | 11/2011 |
| CN | 102255620 | 11/2011 |
| DE | 10002523 | 8/2001 |
| DE | 602004000811 | 10/2006 |
| EP | 0171843 | 2/1986 |
| EP | 0977354 | 2/2000 |
| EP | 1146636 | 10/2001 |
| EP | 1441472 A2 | 7/2004 |
| EP | 1569330 | 5/2006 |
| EP | 1569359 | 5/2007 |
| EP | 1568151 | 8/2007 |
| EP | 2 027 651 | 2/2009 |
| EP | 2027650 | 2/2009 |
| EP | 2027651 | 2/2009 |
| EP | 2388914 | 11/2011 |
| EP | 2 410 655 A1 | 1/2012 |
| JP | 6132736 | 5/1994 |
| JP | 1994069002 | 8/1994 |
| JP | 6252797 | 9/1994 |
| JP | 774551 | 3/1995 |
| JP | 1155041 | 2/1999 |
| JP | 2001237722 | 8/2001 |
| JP | 2001284998 | 10/2001 |
| JP | 2004500775 | 1/2004 |
| JP | 2004048797 | 2/2004 |
| JP | 2005197870 A | 7/2005 |
| JP | 2005244996 | 9/2005 |
| JP | 2009505459 | 2/2009 |
| JP | 2011-229179 | 11/2011 |
| KR | 1020050013782 A | 2/2005 |
| KR | 10-2008-0036078 | 4/2008 |
| KR | 10-1010042 | 1/2011 |
| KR | 10-1010042 B1 | 1/2011 |
| WO | 0077950 | 12/2000 |
| WO | 0167621 A2 | 9/2001 |
| WO | 0233844 | 4/2002 |
| WO | 02060088 | 8/2002 |
| WO | 02076057 | 9/2002 |
| WO | 2004051843 | 6/2004 |
| WO | 2005053151 | 6/2005 |
| WO | 2007054609 | 5/2007 |
| WO | 2007143843 | 12/2007 |
| WO | 2007143844 | 12/2007 |

OTHER PUBLICATIONS

United States Office Action Response dated Oct. 6, 2011, U.S. Appl. No. 12/942,757.
United States Notice of Allowance dated Oct. 19, 2011, U.S. Appl. No. 12/942,757.
Related U.S. Appl. No. 10/781,812, now issued as US Patent No. 7,333,563, filed Feb. 20, 2004.
United States Office Action dated Apr. 23, 2007, U.S. Appl. No. 10/781,812, now issued as US Patent No. 7,333,563.
United States Office Action Response dated Aug. 23, 2007, U.S. Appl. No. 10/781,812, now issued as US Patent No. 7,333,563.
United States Notice of Allowance dated Sep. 21, 2007, U.S. Appl. No. 10/781,812, now issued as US Patent No. 7,333,563.
Related U.S. Appl. No. 12/025,247, now issued as US Patent No. 7,551,689, filed Feb. 4, 2008.
United States Office Action dated Nov. 10, 2008, U.S. Appl. No. 12/025,247, now issued as US Patent No. 7,551,689.

United States Office Action Response dated Jan. 20, 2009, U.S. Appl. No. 12/025,247, now issued as US Patent No. 7,551,689.
United States Notice of Allowance dated Feb. 26, 2009, U.S. Appl. No. 12/025,247, now issued as US Patent No. 7,551,689.
Related U.S. Appl. No. 12/478,812, now issued as US Patent No. 7,787,566, filed Jun. 5, 2009.
United States Office Action dated Jan. 14, 2010, U.S. Appl. No. 12/478,812, now issued as US Patent No. 7,787,566.
United States Office Action Response dated Apr. 13, 2010, U.S. Appl. No. 12/478,812, now issued as US Patent No. 7,787,566.
United States Notice of Allowance dated May 11, 2010, U.S. Appl. No. 12/478,812, now issued as US Patent No. 7,787,566.
United States Notice of Allowance dated Oct. 15, 2010, U.S. Appl. No. 11/763,099, now issued as US Patent No. 7,873,119.
United States Notice of Allowance dated Nov. 19, 2010, U.S. Appl. No. 11/763,099, now issued as US Patent No. 7,873,119.
United States Notice of Allowance dated Dec. 20, 2010, U.S. Appl. No. 11/763,099, now issued as US Patent No. 7,873,119.
United States Notice of Allowance dated Dec. 17, 2010, U.S. Appl. No. 11/763,068, now issued as US Patent No. 7,907,920.
United States Notice of Allowance dated Feb. 4, 2011, U.S. Appl. No. 11/763,068, now issued as US Patent No. 7,907,920.
Response to Examiner's Report corresponding to EP Application No. 07719973.5, dated Nov. 16, 2010.
Response to Examiner's Report corresponding to EP Application No. 07719973.5, dated Oct. 20, 2009.
Australian Office Action, Australian patent application No. 2007260548, dated Apr. 21, 2009.
Australian Exam Response, Australian patent application No. 2007260548, dated Apr. 19, 2010.
Australian Notice of Acceptance, Australian patent application No. 2007260548, dated May 21, 2010.
Japanese Notice of Appeal including an Appeal Brief and Amendment, Japanese patent application No. 2008-525354, as filed with the JPO on Jun. 24, 2011.
Chinese Certificate of Inventive Patent, Chinese patent No. ZL200780000802.0, date of announcement of grant Nov. 10, 2010.
Korean Office Action, Korean patent application No. 10-2008-7003152, delivery date Jan. 4, 2009.
Co-pending U.S. Appl. No. 13/193,589, "Method and Apparatus for Improving Power Amplifier Efficiency in Wireless Communication Systems Having High Peak to Average Power Ratios", filed Jul. 28, 2011.
Indian Office Action corresponding to Indian patent application No. 447/CHENP/2008, dated Dec. 27, 2011.
United States Office Action, U.S. Appl. No. 13/193,589, dated Jan. 18, 2012.
Co-pending U.S. Appl. No. 13/325,895, "Method and Apparatus for Optimizing Transmitter Power Efficiency", filed Dec. 14, 2011.
Co-pending U.S. Appl. No. 12/784,971, "Control of Switcher Regulated Power Amplifier Modules", filed May 21, 2010.
Japanese Pre-Appeal Examination Report corresponding to JP patent application No. 2008-525354, dated Apr. 9, 2012.
United States Office Action response corresponding to U.S. Appl. No. 13/193,589, dated Apr. 18, 2012.
English Abstract for JP publication No. 2005-197870, published on Jul. 21, 2005.
United States Office Action dated Apr. 13, 2011, U.S. Appl. No. 12/784,971.
United States Office Action Response dated Jul. 13, 2011, U.S. Appl. No. 12/784,971.
United States Notice of Allowance dated Sep. 20, 2011, U.S. Appl. No. 12/784,971.
United States Notice of Allowance dated Jan. 24, 2012, U.S. Appl. No. 12/784,971.
Canadian Office Action, Canadian Patent Application No. 2,623,941, dated Mar. 27, 2012.
United States Notice of Allowance dated Mar. 12, 2012, U.S. Appl. No. 12/785,009.
International Search Report/Written Opinion for PCT application No. PCT/CA2007/001055, Aug. 20, 2007.
International Search Report/Written opinion for PCT application No. PCT/CA2007/001057, Oct. 4, 2007

International Preliminary Report on Patentability for PCT application No. PCT/CA2007/001057, Dec. 31, 2008.
European Search Report for EP patent application No. 07719973.5, Jul. 31, 2009.
European Search Opinion for EP patent application No. 07719973.5, Aug. 12, 2009
International Preliminary Report on Patentability for PCT application No. PCT/CA2007/001055, Dec. 31, 2008.
Chinese Office Action for CN patent application No. 2007800008020, Nov. 27, 2009.
Co-pending U.S. Appl. No. 11/763,068, "Improved Control of Switcher Regulated Power Amplifier Modules", filed Jun. 14, 2007.
Co-pending U.S. Appl. No. 12/763,009, "Input Drive Control for Switcher Regulated Power Amplifier Modules", filed Jun. 14, 2007.
Co-pending U.S. Appl. No. 12/785,009, "Input Drive Control for Switcher Regulated Power Amplifier Modules", filed May 21, 2010.
United States Office Action dated Aug. 2, 2010, U.S. Appl. No. 11/763,068.
United States Office Action dated Apr. 14, 2010, U.S. Appl. No. 11/763,099.
United States Office Action Response dated Jul. 14, 2010, U.S. Appl. No. 11/763,099.
Co-pending U.S. Appl. No. 12/784,932, "Method and Apparatus for Optimizing Transmitter Power Efficiency", filed May 21, 2010.
Co-pending U.S. Appl. No. 12/847,612, "Method and Apparatus for Improving Power Amplifier Efficiency in Wireless Communication Systems Having High Peak to Average Power Ratios", filed Jul. 30, 2010.
Co-pending U.S. Appl. No. 12/276,650, "Method and Apparatus for Optimizing Transmitter Power Efficiency", filed Nov. 24, 2008.
Larson et al., "Device and Circuit Approaches for Improved Wireless Communications Transmitters", Oct. 1, 1999, IEEE Personal Communications, IEEE Communications Society, University of California, San Diego, pp. 18-23.
United States Office Action dated Mar. 29, 2010, U.S. Appl. No. 12/276,650.
United States Office Action Response dated Jun. 28, 2010, U.S. Appl. No. 12/276,650.
United States Notice of Allowance dated Aug. 13, 2010, U.S. Appl. No. 12/276,650.
Japanese Office Action for Japanese Patent Application No. 2008-525354, dated Apr. 28, 2010.
Korean Office Action for Korean Patent Application No. 10-2008-7003152, dated Jan. 4, 2009.
European Office Action for European Application No. 07719973.5, dated Jul. 7, 2010.
Co-pending U.S. Appl. No. 12/842,126, "Method of Power Amplifier Switching Power Control Using Post Power Amplifier Power Detection", filed Jul. 23, 2010.
United States Office Action Response dated Sep. 27, 2010, U.S. Appl. No. 11/763,068.
United States Notice of Allowance dated Oct. 1, 2010, U.S. Appl. No. 11/763,099.
United States Office Action, U.S. Appl. No. 12/847,612, dated Oct. 27, 2010.
United States Notice of Allowance, U.S. Appl. No. 11/763,068, dated Nov. 24, 2010.
Korean Notice of Decision for Patent, Korean Patent Application No. 10-2008-7003152, dated Nov. 15, 2010.
United States Office Action, U.S. Appl. No. 12/785,009, dated Dec. 28, 2010.
Maksimovic, D. et al., "60% Efficient 10-GHz Power Amplifier with Dynamic Drain Bias Control", IEEE Transactions on Microwave Theory and Techniques, IEEE Service Center, Piscataway, NJ, US, vol. 52, No. 3, Mar. 1, 2004, pp. 1077-1081.
Japanese Office Action, Japanese Application No. 2008-525354, dated Feb. 25, 2011.
United States Office Action Response, U.S. Appl. No. 12/847,612, dated Jan. 26, 2011.
United States Notice of Allowance, U.S. Appl. No. 12/847,612, dated Apr. 5, 2011.
Canadian Office Action, Canadian Patent Application No. 2,623,941, dated Apr. 11, 2011.

United States Office Action Response, U.S. Appl. No. 12/785,009, dated May 11, 2011.
European Examination Report, European Patent Application No. 07719973.5, dated Jun. 10, 2011.
United States Office Action, U.S. Appl. No. 12/785,009, dated Jul. 14, 2011.
European Office Action Response corresponding to EP Application No. 07719973.5, dated Oct. 13, 2011.
Canadian Office Action Response corresponding to CA Application No. 2,623,941, dated Oct. 7, 2011.
United States Office Action Response corresponding to U.S. Appl. No. 12/785,009, dated Oct. 12, 2011.
Related U.S. Appl. No. 10/724,951, now issued as US Patent No. 7,471,738, filed Dec. 1, 2003.
United States Office Action dated Feb. 9, 2007, U.S. Appl. No. 10/724,951, now issued as US Patent No. 7,471,738.
United States Office Action Response dated May 23, 2007, U.S. Appl. No. 10/724,951, now issued as US Patent No. 7,471,738.
United States Office Action dated Aug. 7, 2007, U.S. Appl. No. 10/724,951, now issued as US Patent No. 7,471,738.
United States Office Action Response dated Dec. 20, 2007, U.S. Appl. No. 10/724,951, now issued as US Patent No. 7,471,738.
United States Notice of Allowance dated Aug. 26, 2008, U.S. Appl. No. 10/724,951, now issued as US Patent No. 7,471,738.
Co-pending U.S. Appl. No. 12/942,757, filed Nov. 9, 2010.
United States Office Action dated Feb. 16, 2011, U.S. Appl. No. 12/942,757.
United States Office Action Response dated May 16, 2011, U.S. Appl. No. 12/942,757.
Japanese Notice of Allowance, Japanese Patent Application No. 2008-525353, dated Jan. 24, 2012.
Japanese Certificate of Patent, Japanese Patent Application No. 2008-525353 now issued as Japanese Patent No. 4922299, dated Feb. 10, 2012.
United States Notice of Allowance dated May 7, 2012, U.S. Appl. No. 13/193,589.
Korean Notice of Decision for Patent, Korean Patent Application No. 2008-7003154, dated Aug. 19, 2010.
U.S. 6,560,446, Oct. 2002, Ramachandran (withdrawn).
Korean Certificate of Patent, Korean Patent Application No. 2008-7003154, dated Oct. 13, 2010.
Extended European Search Report, European Patent Application No. 07719971.9, Jul. 31, 2009.
Response to Examination Report, European Patent Application No. 07719971.9, Oct. 1, 2009.
Response to Examination Report, European Patent Application No. 07719971.9, Nov. 17, 2010.
Result of Consultation, European Patent Application No. 07719971.9, Jun. 10, 2011.
Response, European Patent Application No. 07719971.9, Aug. 18, 2011.
Examiner's first report on Australian Patent Application No. 2007260547, dated Jul. 8, 2009.
Australian Notice of Acceptance, Australian Patent Application No. 2007260547, dated Aug. 3, 2010.
Certificate of Invention Patent, Chinese Patent Application No. 200780000803.5, dated Nov. 23, 2011.
United States Supplemental Notice of Allowability, U.S. Appl. No. 11/763,099, dated Oct. 15, 2010.
United States Supplemental Notice of Allowability, U.S. Appl. No. 11/763,099, dated Nov. 19, 2010.
United States Supplemental Notice of Allowability, U.S. Appl. No. 11/763,099, dated Dec. 20, 2010.
United States Notice of Allowance dated Jun. 26, 2012, U.S. Appl. No. 12/785,009.
European Communication under Rule 21(3) EPC, European Patent Application No. 07719973.5, dated Jul. 30, 2012.
Indian Office Action dated Aug. 13, 2012, Indian Patent Application No. 447/CHENP/2008.
Canadian Notice of Allowance dated Aug. 27, 2012, Canadian Patent Application No. 2,623,941.
Response to Japanese Official Action (Inquiry) dated Jun. 25, 2012, Japanese Patent Application No. 2008-525354.
US 6,560,446, 05/2003, Ramachandran (withdrawn)

CONTROL OF SWITCHER REGULATED POWER AMPLIFIER MODULES

CROSS-REFERENCE TO RELATED APPLICATIONS

This application is a continuation of U.S. patent application Ser. No. 12/784,971, filed May 21, 2010, which is a continuation of U.S. patent application Ser. No. 11/763,068, filed on Jun. 14, 2007, which claims the benefit of U.S. Provisional Application No. 60/813,352, filed on Jun. 14, 2006. U.S. patent application Ser. No. 11/763,068 issued to patent as U.S. Pat. No. 7,907,920. The entire contents of application Ser. No. 12/784,971, application Ser. No. 11/763, 068 and of Application No. 60/813,352 are hereby incorporated by reference.

FIELD

This description relates generally to wireless communication devices and more particularly to control of switcher regulated power amplifier using input drive.

BACKGROUND

Handheld wireless communication devices are powered by one or more internal batteries. A major performance criterion for such devices is their battery life, and a large portion of battery power is consumed in a power amplification block of the device's transmitter. In many handheld wireless applications, a switched mode power supply, which provides the supply voltage to a power amplifier in the power amplification block, is used to reduce overall power consumption. However, this requires careful control of the switched mode power supply to achieve optimal power savings. In order to simplify control, many conventional designs use a fixed-step, or continuous control technique for controlling the switched mode power supply. However, without employing additional information, both of these techniques may result in sub-optimal power savings, may be more cumbersome to calibrate, and may have an adverse affect on the output signal's compression artifacts. With most designs, the compression artifacts are very low compared to the signal power until the supply voltage provided to the power amplifier approaches its transmit power limit at which point the compression artifacts increase.

BRIEF DESCRIPTION OF THE DRAWINGS

For a better understanding of the exemplary embodiments described herein and to show more clearly how they may be carried into effect, reference will now be made, by way of example only, to the accompanying drawings in which.

DETAILED DESCRIPTION

Figure 1:
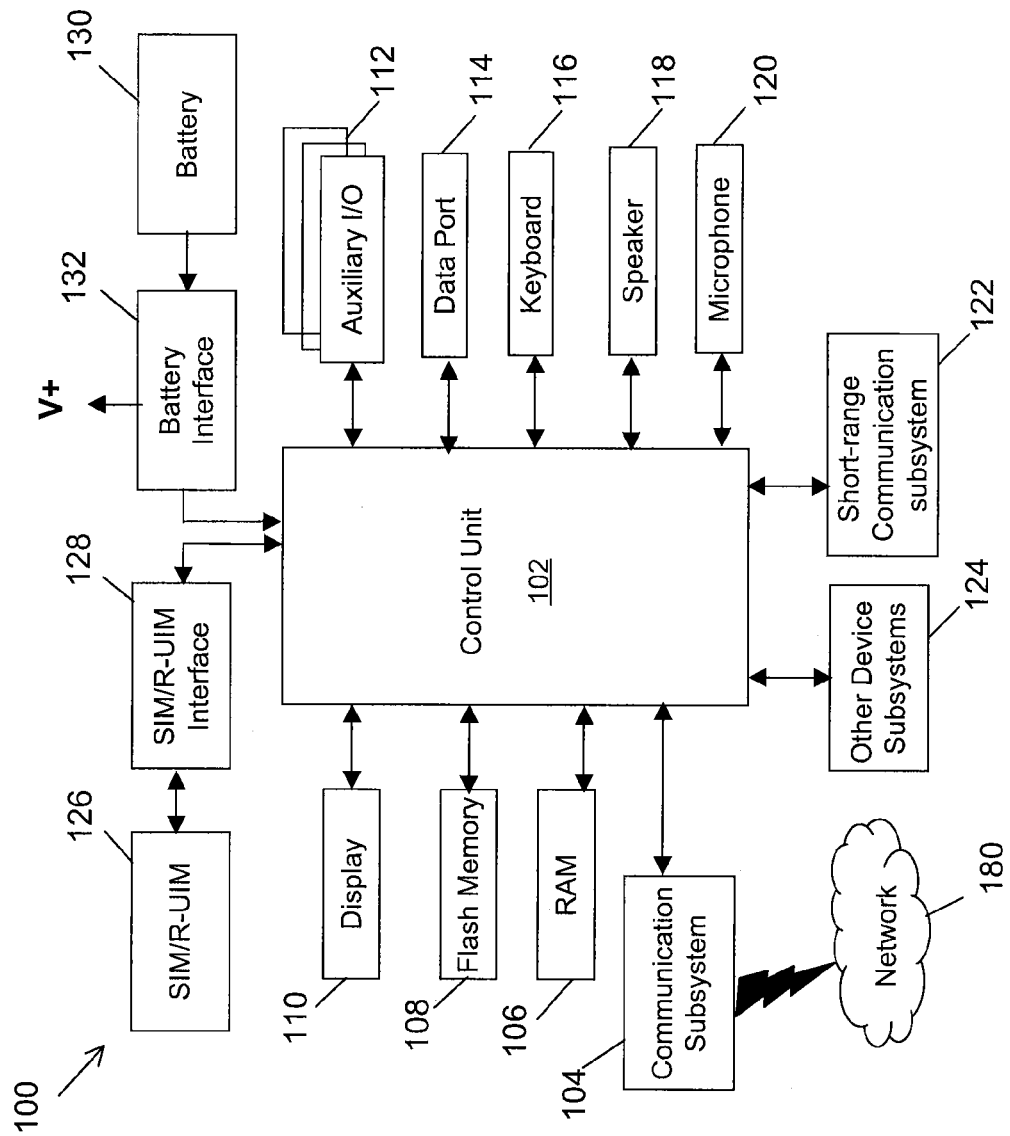
FIG. 1 is a block diagram of an exemplary embodiment of a wireless communications device.

It will be appreciated that for simplicity and clarity of illustration, where considered appropriate, reference numerals may be repeated among the figures to indicate corresponding or analogous elements. In addition, specific details may be included to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein, but rather as merely describing the implementation of the various embodiments described herein.

A wireless communications device is a two-way communications device with advanced data communication capabilities having the capability to communicate with other computer systems. The wireless communications device may also include the capability for voice communications. Depending on the functionality provided by the wireless communications device, it may be referred to as a data messaging device, a two-way pager, a cellular telephone with data messaging capabilities, a wireless Internet appliance, or a data communications device (with or without telephony capabilities). The wireless communications device communicates with other devices through a network of transceiver stations.

Referring first to FIG. 1, shown therein is a block diagram of an exemplary embodiment of a wireless communications device 100 which may also be referred to as a mobile communications device. The wireless communications device 100 comprises a number of components, such as a control unit 102 which controls the overall operation of the wireless communications device 100. The control unit 102 may be a microprocessor or a microcontroller. Any commercially available microcontroller, such as a microcontroller available from ARM, Motorola, Intel and the like may be used for the control unit 102.

Communication functions, including data and possibly voice communications, are performed through the communication subsystem 104. The communication subsystem 104 receives messages from and sends messages to a wireless network 180. In one embodiment, the communication subsystem 104 may be configured in accordance with CDMA2000 standards, or with Global System for Mobile Communication (GSM) and General Packet Radio Services (GPRS) standards. The GSM/GPRS wireless network is used worldwide and it is expected that these standards will eventually be superseded by the Enhanced Data GSM Environment (EDGE) and Universal Mobile Telecommunications Service (UMTS) standards. New standards are still being defined, but it is believed that they will have similarities to the network behaviour described herein, and it will also be understood that the device is intended to use any other suitable standards that are developed in the future. The wireless link connecting the communications subsystem 104 with the network 180 represents one or more different Radio Frequency (RF) channels, operating according to defined protocols specified for CDMA2000 or GSM/GPRS communications. With the network protocols, these channels are capable of supporting both circuit switched voice communications and packet switched data communications.

The control unit 102 also interacts with additional subsystems such as a Random Access Memory (RAM) 106, a flash memory 108, a display 110, an auxiliary input/output (I/O) subsystem 112, a data port 114, a keyboard 116, a speaker 118, a microphone 120, a short-range communications subsystem 122 and other device subsystems 124. Some of these components may be optional depending on the particular type of wireless communications device. Other types of non-volatile storage devices known in the art may be used rather than the flash memory 108. The keyboard 116 may be a telephone-type keypad, an alphanumeric keyboard or some other suitable keypad.

Some of the subsystems of the wireless communications device 100 perform communication-related functions, whereas other subsystems may provide "resident" or on-device functions. By way of example, the display 110 and the keyboard 116 may be used for both communication-related functions, such as entering a text message for transmission over the network 180, and device-resident functions such as a calculator or task list. Operating system software, and other various algorithms, used by the control unit 102 is typically stored in a persistent store such as the flash memory 108, which may alternatively be a read-only memory (ROM) or similar storage element (not shown). Those skilled in the art will appreciate that the operating system, specific device applications, or parts thereof, may be temporarily loaded into a volatile store such as the RAM 106.

The wireless communications device 100 may send and receive communication signals over the network 180 after required network registration or activation procedures have been completed. Network access is associated with a subscriber or user of the wireless communications device 100. To identify a subscriber, the wireless communications device 100 requires a Subscriber Identity Module or "SIM" card 126 or an R-UIM (Removable User Identity Module) to be inserted in a SIM interface 128 (or an R-UIM interface) in order to communicate with the network 180. The SIM card or R-UIM 126 is one type of a conventional "smart card" that is used to identify a subscriber of the wireless communications device 100 and to personalize the wireless communications device 100, among other things. Alternatively, user identification information can also be programmed into flash memory 108. Services may include: web browsing and messaging such as email, voice mail, Short Message Service (SMS), and Multimedia Messaging Services (MMS). More advanced services may include: point of sale, field service and sales force automation.

The wireless communications device 100 is a battery-powered device and includes a battery interface 132 for receiving one or more rechargeable batteries 130. The battery interface 132 is coupled to a regulator (not shown) which assists the battery 130 in providing supply power V+ to the wireless communications device 100. Although current technology makes use of a battery, future power source technologies such as micro fuel cells may provide the power to the wireless communications device 100.

The control unit 102, in addition to its operating system functions, enables execution of software applications on the wireless communications device 100. A set of applications which control basic device operations, including data and voice communication applications will normally be installed on the wireless communications device 100 during its manufacture. Another application that may be loaded onto the wireless communications device 100 may be a personal information manager (PIM). A PIM has the ability to organize and manage data items of interest to a subscriber, such as, but not limited to, e-mail, calendar events, voice mails, appointments, and task items. A PIM application has the ability to send and receive data items via the wireless network 180. In one embodiment, PIM data items are seamlessly integrated, synchronized, and updated via the wireless network 180 with the wireless communications device subscriber's corresponding data items stored and/or associated with a host computer system. This functionality creates a mirrored host computer on the wireless communications device 100 with respect to such items. This is especially advantageous where the host computer system is the wireless communications device subscriber's office computer system.

Additional applications may also be loaded onto the wireless communications device 100 through the network 180, the auxiliary I/O subsystem 112, the data port 114, the short-range communication subsystem 122, or any other suitable device subsystem 124. This flexibility in application installation increases the functionality of the wireless communications device 100 and may provide enhanced on-device functions, communication-related functions, or both. For example, secure communication applications may enable electronic commerce functions and other such financial transactions to be performed using the wireless communications device 100.

The data port 114 enables a subscriber to set preferences through an external device or software application and extends the capabilities of the mobile device 100 by providing for information or software downloads to the mobile device 100 other than through a wireless communication network. The alternate download path may, for example, be used to load an encryption key onto the mobile device 100 through a direct and thus reliable and trusted connection to provide secure device communication.

The short-range communication subsystem 122 provides for communication between the wireless communications device 100 and different systems or devices, without the use of the network 180. For example, the subsystem 122 may include an infrared device and associated circuits and components for short-range communication. Examples of short-range communication may include standards developed by the Infrared Data Association (IrDA), Bluetooth, and the 802.11 family of standards developed by IEEE.

In use, a received signal such as a text message, an e-mail message, or web page download will be processed by the communications subsystem 104 and input to the control unit 102. The control unit 102 will then process the received signal for output to the display 110 or alternatively to the auxiliary I/O subsystem 112. A subscriber may also compose data items, such as e-mail messages, for example, using the keyboard 116 in conjunction with display 110 and possibly auxiliary I/O subsystem 112. The auxiliary subsystem 112 may include devices such as: a touch screen, mouse, track ball, infrared fingerprint detector, or a roller wheel with dynamic button pressing capability. The keyboard 116 may be an alphanumeric keyboard and/or telephone-type keypad. A composed item may be transmitted over the network 150 through the communication subsystem 104.

For voice communications, the overall operation of the wireless communications device 100 is substantially similar, except that most of the received signals are output to the speaker 118, and most of the signals for transmission are transduced by microphone 120. Alternative voice or audio I/O subsystems, such as a voice message recording subsystem, may also be implemented on the wireless communications device 100. Although voice or audio signal output is accomplished primarily through the speaker 118, the display 110 may also be used to provide additional information such as the identity of a calling party, duration of a voice call, or other voice call related information.

Figure 2:
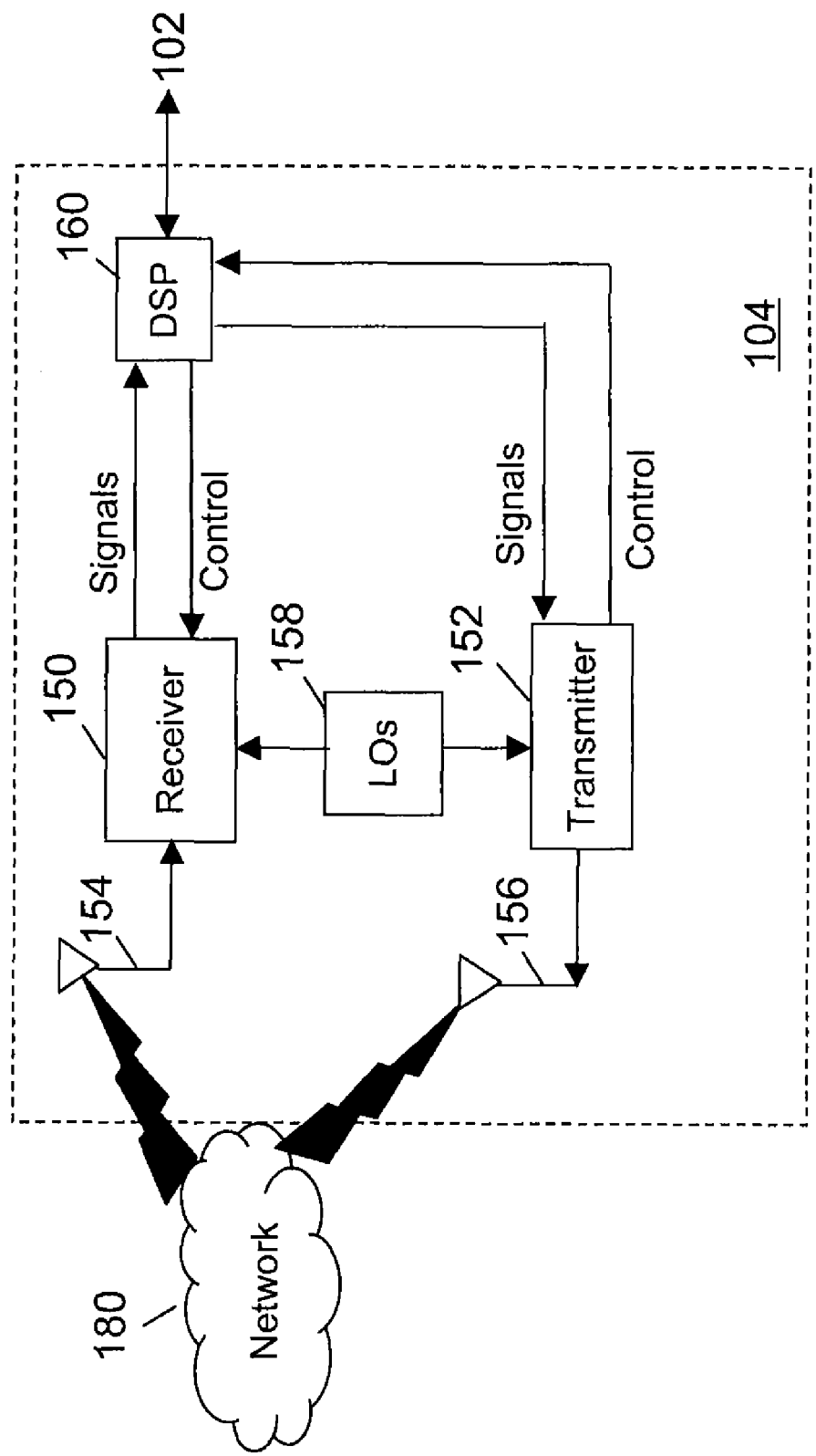
FIG. 2 is a block diagram of an exemplary embodiment of a communication subsystem component of the mobile device of FIG. 1.

Referring now to FIG. 2, a block diagram of the communication subsystem component 104 of FIG. 1 is shown. The communication subsystem 104 comprises a receiver 150, a transmitter 152, one or more embedded or internal antenna elements 154, 156, Local Oscillators (LOs) 158, and a processing module such as a Digital Signal Processor (DSP) 160.

The particular design of the communication subsystem 104 is dependent upon the network 180 in which the mobile device 100 is intended to operate, thus it should be understood that the design illustrated in FIG. 2 serves only as one example. Signals received by the antenna 154 through the network 180 are input to the receiver 150, which may perform such common receiver functions as signal amplification, frequency down conversion, filtering, channel selection, and analog-to-digital (ND) conversion. ND conversion of a received signal allows more complex communication functions such as demodulation and decoding to be performed in the DSP 160. In a similar manner, signals to be transmitted are processed, including modulation and encoding, by the DSP 160. These DSP-processed signals are input to the transmitter 152 for digital-to-analog (D/A) conversion, frequency up conversion, filtering, amplification and transmission over the network 180 via the antenna 156. The DSP 160 not only processes communication signals, but also provides for receiver and transmitter control. For example, the gains applied to communication signals in the receiver 150 and transmitter 180 may be adaptively controlled through automatic gain control algorithms implemented in the DSP 160.

The wireless link between the mobile device 100 and the network 180 may contain one or more different channels, typically different RF channels, and associated protocols used between the mobile device 100 and the network 180. An RF channel is a limited resource that must be conserved, typically due to limits in overall bandwidth and limited battery power of the mobile device 100.

When the mobile device 100 is fully operational, the transmitter 152 is typically keyed or turned on only when it is sending to the network 180 and is otherwise turned off to conserve resources. Similarly, the receiver 150 is periodically turned off to conserve power until it is needed to receive signals or information (if at all) during designated time periods.

The various embodiments described herein relate to a power management block that can be used in the transmitter 152 of the communication subsystem 104. The power management block provides improved control for the gain control signal provided to a pre-amplifier and the supply voltage provided to a power amplifier. The pre-amplifier and the power amplifier are both in a power amplification block of the transmitter 152. The power expended by the power amplifier is optimized by employing a continuous control in which at least one feedback loop is employed to take into account various characteristics of certain components of the transmitter including the pre-amplifier and the power amplifier as well as various control signals. The structure and processing methodology employed by the power management block also results in constant code domain performance, as will be explained in further detail below.

In communication systems that employ orthogonal code channels to combine and separate various streams of data, the designer must be careful not to accidentally combine, leak or add noise to the different channels by distorting the composite signal. In most designs, the final amplifier (usually the power amplifier) is the device most likely to be driven into non-linear operation. This is especially true when power saving techniques are used. If the degree to which the power amplifier is compressed varies considerably during its range of operation, it is possible that the undesirable effects in the code domain will be present at some power levels and not others. This makes pre-compensation of the various code channels impossible unless one has the means to vary the compensation as the power demands are changed. A power amplifier with nearly constant compression will aid in the overall design of a transmitter with constant code domain performance and help simplify the baseband design without sacrificing power efficiency.

Figure 3:
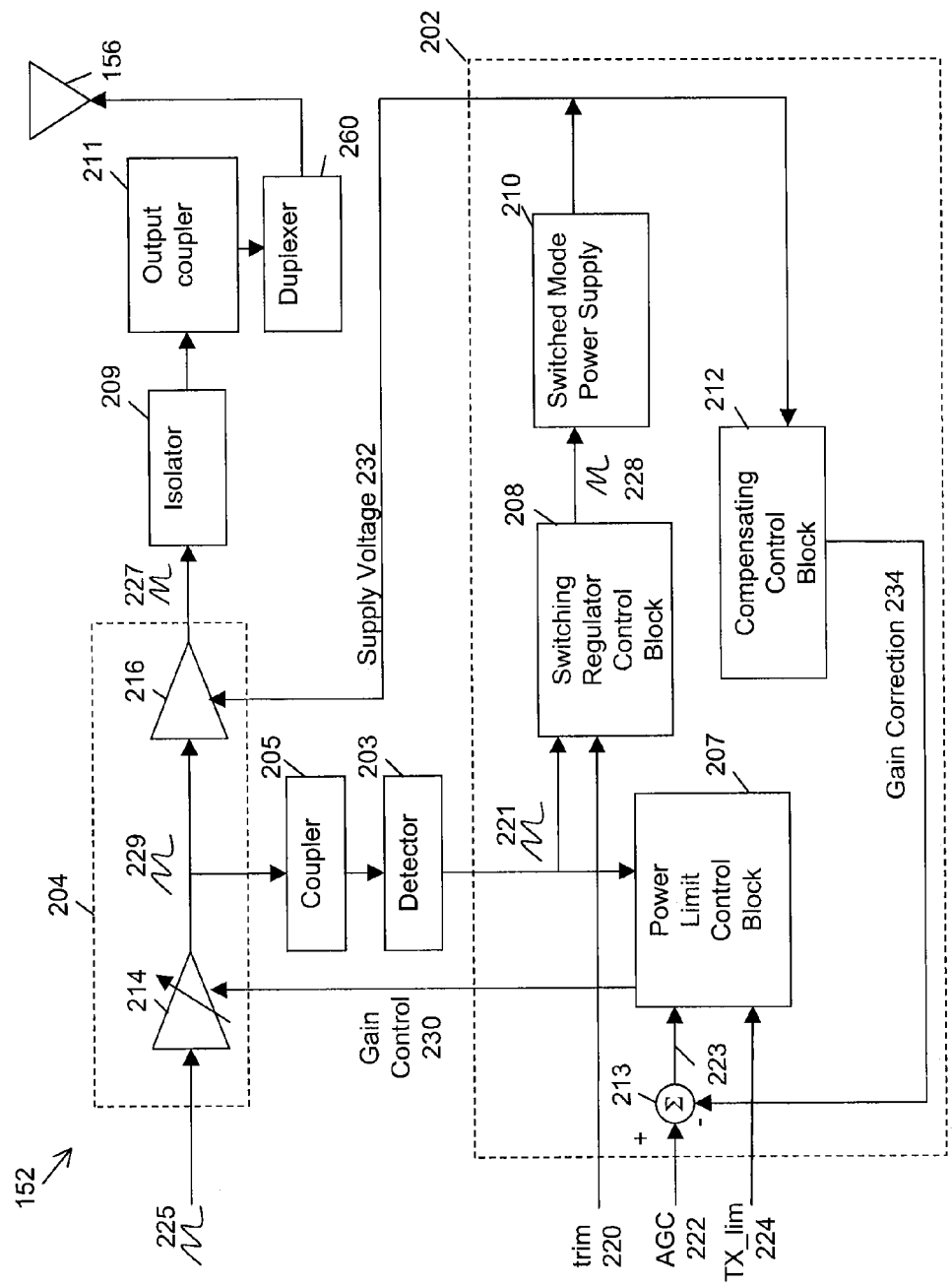
FIG. 3 is a block diagram of an exemplary embodiment of a portion of a power management block and an amplification block of the communications subsystem of the wireless communications device.

Referring now to FIG. 3, shown therein is a block diagram of an exemplary embodiment of a portion of the transmitter 152, a duplexer 260 and the antenna 156 of the communication subsystem 104. The transmitter 152 includes a power management block 202, a detector 203, a coupler 205, a power amplification block 204, an isolator 209 and an output coupler 211. The isolator 209 and the output coupler 211 are optional as is described further below. The duplexer 260 is also connected to the receiver 150 (not shown). The power management block 202 includes a power limit control block 207, a switching regulator control block 208, a switched mode power supply 210, a compensating control block 212, and a summer 213. The power amplification block 204 includes a pre-amplifier 214, and a power amplifier 216. In alternative embodiments, the output coupler 211 can be fed to a detector for power limiting for some cases.

It should also be noted that the power limit control block 207, the compensating control block 212, the summer 213 and the TX_lim control signal 224 are optional in some embodiments. In these embodiments, the AGC signal 222 is provided as the gain control signal 230 to the pre-amplifier 214. Depending on the particular application, the power limit control loop and the compensating loop can be used separately. These loops are discussed in further detail below.

The wireless communications device 100 generates a data signal that is to be transmitted using the transmitter 152. The data signal is typically a comparatively low frequency signal that is generally referred to as a baseband signal. The baseband signal is processed by various components (not shown but commonly known to those skilled in the art) of the communication subsystem 104 and mixed with a carrier signal having a substantially higher frequency to produce a transmission signal 225. The transmission signal 225 is amplified by the power amplification block 204 to produce an amplified transmission signal 227 for wireless transmission. The amplified transmission signal 227 is then sent through the isolator 209, the output coupler 211, and the duplexer 260 to be radiated by the antenna 156. The isolator 209 protects the power amplification block 204 from reflections or other signal energy that comes from the downstream components, such as the antenna 156. The isolator 209 can sometimes be used to stabilize the performance of the duplexer 260.

The pre-amplifier 214 is a variable gain amplifier that produces a pre-amplified transmission signal 229. The gain of the pre-amplifier 214 is varied to provide a first amount of gain depending on the desired power level for the amplified transmission signal 227. The gain of the pre-amplifier 214 is dictated by a gain control signal 230 provided by the power limit control block 207. The power amplifier 216 then amplifies the pre-amplified transmission signal 229 to provide the remainder of the required gain. A filter (not shown) may optionally be added after the pre-amplifier 214 for removing noise that is introduced into the pre-amplified transmission signal 229 by the pre-amplifier 214 and prior stages of the wireless communications device 100. A person skilled in the art will be capable of selecting appropriate parameters for this filter.

At any point during operation, the power amplifier 216 requires a supply voltage signal 232 with a magnitude that is sufficient so that the amplified transmission signal 227 can be produced with at most a maximum level of acceptable distortion. If the power amplifier 216 is always operating with the same level of acceptable distortion, then a fixed correction of the corresponding baseband data can be done to counteract the distortion while saving power. Accordingly, when the amplified transmission signal 227 is at any power within the transmitter's dynamic range, the power amplifier 216 should have constant headroom to ensure that the amplified transmission signal 227 is at most, always distorted in the same fashion.

One reason for significant power loss in the power amplification block 204 is that the amplified transmission signal 227 is rarely at the maximum level mentioned above and is usually at a much lower power level. The excess headroom between the supply voltage 232 provided to the power amplifier 216 and the magnitude of the amplified transmission signal 227 is dissipated as heat. To avoid this power loss, the switched mode power supply 210 is controlled by the switching regulator control block 208 to minimize the headroom but allow the power amplifier 216 to produce the amplified transmission signal 227 with the instantaneous maximum power that is required for transmission.

A trim signal 220 is a control signal that is provided to the power management block 202 by the control unit 102. The trim signal 220 is used to remove unit-to-unit variation during factory calibration of the wireless communications device 100. The variation is due to offsets caused by part variation for the components used to build the transmitter 152 and the control loops. The trim signal 220 trims or reduces variations caused by these offsets/tolerances. This can be done by sampling the output of the switched mode power supply 210 during operation and adjusting the value for the trim signal 220 to obtain acceptable performance. In addition, the compression artifacts of the transmitter 152 can be measured and the value of the trim signal 220 adjusted until the desired amount of distortion is observed. The trim signal 220 can be optional in some designs depending on the tolerance stackup.

A detector 203 senses the pre-amplified transmission signal 229, which is the input drive for the power amplifier 216, via a coupler 205. The detector 203 then produces a detected pre-amp output signal 221. In some implementations, the detector 203 can be an approximation to a true RMS detector with a linear scaled output. However, detectors having other forms of output, including a log output, may also be utilized. The location of the detector 203 results in loop stability and power savings by not coupling with the output of the power amplifier 216 to sense the amplified transmission signal 227. Gain expansion of the power amplifier 216 would result in a control system with right hand poles, if the detector 203 is placed where it can be influenced by the gain expansion (i.e. on the output side of the power amplifier 216). With the detector 203 at the output of the power amplifier 216, an increase in power, caused by gain expansion or maybe noise, for example, would cause the detected output to increase and drive up the supply voltage signal 232. The resulting gain expansion would further increase the detected power. The process would then escalate. This is avoided by placing the detector 203 at the output of the pre-amplifier 214.

A person skilled in the art can select the appropriate coupler 205 to use with the detector 203. This selection process will be based on parameters such as the type of power amplifier 216, tuning of the various control blocks in the power management block 202, and intended overall performance targets for the power management block 202. A directional coupler can be used for the coupler 205, but a resistive tap may also be used if the pre-amplifier 214 has sufficient reverse isolation.

The detected pre-amp output signal 221 and the trim signal 220 are provided to the power management block 202 to limit the output power of the amplification block 204. This is done by using these signals, as well as other information discussed below, to perform at least one of adjusting the gain of the pre-amplifier 214 and controlling the switched mode power supply 210 to provide the supply voltage signal 232 at a certain level. It should be noted that the main source of variation in the transmitter design is not due to the thermal characteristics of the power amplifier 216 but rather the variations in the thermal and frequency characteristics of the pre-amplifier 214, which are poor. Consequently, by detecting the output power 229 of the pre-amplifier 214, most of the variation in the transmitter 152 can be removed while decreasing the power losses in the transmitter 152.

The switching regulator control block 208 controls the switched mode power supply 210 to provide the supply voltage signal 232 in an optimal fashion based on the trim signal 220 and the detected pre-amp output signal 221. The switch control block 208 applies a switching control transfer function to the detected pre-amp output signal 221 and the trim signal 220 to generate a switching supply control signal 228 to control the switched mode power supply 210. In addition, in some implementations, it may be desirable to filter certain high frequency noise components from the supply voltage signal 232. The switched mode power supply 210 may be a DC-DC switch converter. However, a broad class of devices may be utilized as the switched mode power supply 210 as long as the output voltage, current, efficiency and noise requirements of the amplification block 204 are met.

Through the appropriate selection of the detector 203 and values for the switching control transfer function, the switching regulator control block 208 can provide control values to the switched mode power supply 210 to hold the power amplifier 216 in a state of constant compression. This means that the compression artifacts of the amplified transmission signal 227 are maintained at a constant fraction of the actual data signal. Consequently, power savings are optimized by minimizing the supply voltage overhead of the power amplifier 216 at all transmission powers possible, and the effects of the compression of the power amplifier 216 on the amplified transmission signal 227 becomes a constant function of the transmission power. This is because, the power amplifier 216 is being provided with as minimal amount of supply power by the supply voltage signal 232, while still meeting various specifications such as maximum acceptable distortion, over a wide range of transmission power. This allows a static compensation to be applied at the baseband rather than another compensation method that varies with transmission power. In other words, if the compression of the power amplifier 216 changes as a function of power, a dynamic compensation of the relative code domain power is required. The term code domain power refers to the relative power to noise ratio of the code channel in question (the other channels are orthogonal and appear like noise). Static compensation refers to setting the code domain correction to compensate for the characteristics of the hardware but not for varying power.

The switching control transfer function is derived from a characterization of the response of the detector 203, control curves of the switched mode power supply 210, and the response of the power amplifier 216 to input drive. These values are captured by method 300.

Figure 4:
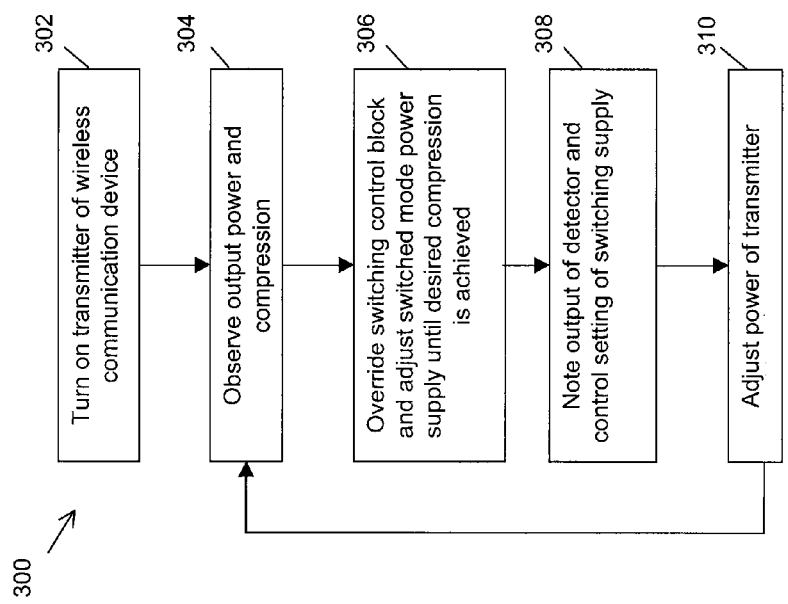
FIG. 4 is a flow chart diagram of an exemplary method that can be used for finding appropriate values for a switching control transfer function for a switch control block of the power management block.

Referring now to FIG. 4, shown therein is a flow chart diagram of an exemplary method 300 that can be used for determining appropriate values for the switching control transfer function for the switching regulator control block 208. The method 300 is performed on several wireless communication devices and the test results are aggregated to form the switching control transfer function used by the switching regulator control block 208. The method 300 begins at step 302 at which the transmitter 152 is turned on. At step 304, the amplified transmission signal 227 and the compression of the power amplifier 216 are observed. At step 306, the switching regulator control block 208 is overridden, and the switched mode power supply 210 is adjusted until the desired compression is achieved for the power amplifier 216. Step 306 sometimes jumps directly (not shown) to step 310 if the voltage adjustment perturbs the operating power too much. The output of the detector 203 (i.e. the detected pre-amp output signal 221) and the control setting of the switched mode power supply 210 are noted in a data table at step 308. At step 310, the power of the transmitter 152 is adjusted and steps 304 to 310 are repeated until enough data points are obtained.

In other words, the switching control transfer function can be generated by looking at several different output power levels for the power amplifier 216, and decreasing the supply voltage signal for of these levels until an acceptable minimum level of headroom is obtained for each power level. This provides a first relationship between the power level of the power amplifier 216 and the level of the supply voltage signal 232. These different power levels are then related to the level of input drive (i.e. the output of the detector 203) while the supply voltage signal 232 is held at the minimum level just discovered for each power level to obtain a relationship between the level of input drive and the power level of the power amplifier 216. These two relations are then combined to define the switching control transfer function between the output of the detector 203 and the output of the switched mode power supply 210. The step response of the switching control transfer function can then be observed, either through modeling or actual testing, and certain parameters of the transfer function are adjusted to obtain acceptable timing.

The data points generated through the method 300 are then used to derive the optimal switching control transfer function for the switching regulator control block 208. An option at this point is to employ some interpolation between the measured points if so desired. While the method 300 generates static values for obtaining the switching control transfer function of the switching regulator control block 208, the method 300 can be modified where the transmitter power is stepped so that dynamic characteristics are observed. At this point, an optional correction can be added for the time responses of the power management and amplification blocks 202 and 204. This can be done in either hardware or software. The steps to perform this are: 1) measure the step response of the system, 2) analyze the shape of the response to determine the compensation needed for the transfer functions in order to meet timing requirements, 3) apply the compensation and test the system, and 4) go back to step one if necessary and repeat until the performance is satisfactory. This process is fairly iterative as one sometimes finds some undesired side effects during testing. The switching control transfer function can then be defined at this point by looking at the step response of the power management and amplification blocks 202 and 204 and generating the appropriate inverse.

The switching control transfer function employed by the switching regulator control block 208 can be realized with hardware by using a filter with a linear, first-order low pass function and an offset. The filter is offset a bit to compensate for the response of the switcher/other circuits which don't operate properly at 0 volts. Implementation as a filter can be done by taking the desired time response of the switching control transfer function, applying the Laplace transform to it, then synthesizing the filter based on the poles and zeros that are generated. However, the switching control transfer function can also be realized with software by using a look-up table.

The response time of the switching control transfer function is taken into consideration since the time response of the entire transmitter 152 is subject to regulatory requirements for the relationship between power and time which is network dependant. As such, the response of each block is considered since, for instance, sloppy performance in the switched mode power supply 210 means that more compensation is needed elsewhere. Time response is also a factor when software is used to implement the switching control transfer function. With software, the analysis is done assuming discrete time steps. Time response for software depends in part on the guaranteed latency of the software used to do the computations and/or lookups. On a processor with many applications running concurrently time response depends on: 1) code efficiency, and 2) the operating system, which can ensure guaranteed latencies when executing real time code. In general, the timing of the components is adjusted to provide a best fit to the timing requirements that are stipulated by the standard and network providers. The value for one timing parameter may need to be traded off against the value for another timing parameter.

The gain control signal 230 is set by the power limit control block 207 based on various inputs. An automatic gain control (AGC) signal 222 and a transmit limit (TX_lim) control signal 224 are provided by the control unit 102. Alternatively, these signals can be provided by a processor in the communication subsystem 104 if one exists. The TX_lim control signal 224 specifies the maximum allowable power of the output of the power amplifier 216. The AGC 222 is modified by the output of the compensating control block 212. The power limit control block 207 also receives the detected pre-amp output signal 221, and combines these signals to reduce the input drive to the power amplifier 216 by controlling the gain of the pre-amplifier 214. The effect of reduced input drive is a reduction in the power of the amplified transmission signal 227.

Figure 5:
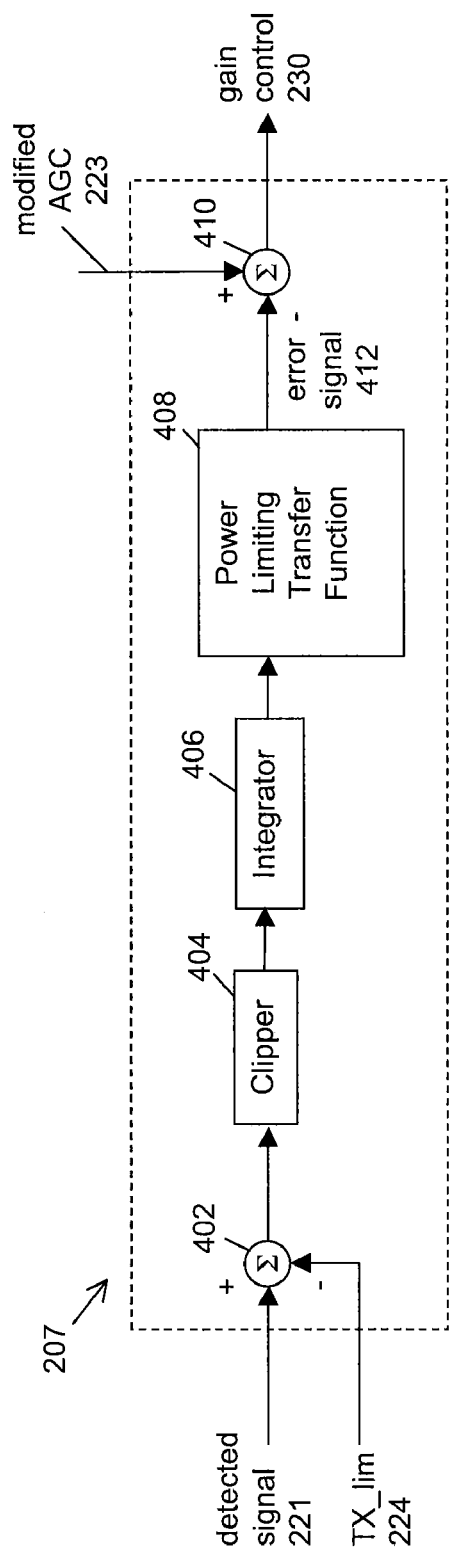
FIG. 5 is a block diagram of an exemplary embodiment of a power limit controller of the power management block.

Referring now to FIG. 5, shown therein is a block diagram of an exemplary embodiment of the power limit control block 207. The power limit control block 207 includes a summer 402, a clipper 404, an integrator 406, a power limiting transfer function 408, and a second summer 410. The power limit control block 207 can anticipate an over power condition before it occurs and provide appropriate values for the gain control signal 230 to prevent the over power condition from occurring. This is based on the selection of particular values for the power limiting transfer function 408, and by examining both the power error signal (i.e. the output of summer 402) and the rate of change of the power error signal (i.e. the error signal 412) before generating new values for the gain control signal 230. The rate of change of these signals is related to the rate of change of the output of the detector 203. If there is a high rate of change, there is likely to be an overshoot in the output power and an over power condition will result.

The power error signal is obtained when the summer 402 subtracts the TX_lim signal 224 from the detected pre-amp output signal 221. This difference is then passed sequentially through the clipper 404, the integrator 406, and the power limiting transfer function 408 to produce the error signal 412. The clipper 404 produces a clipped power error signal by converting all negative input values to zero, and passing positive values with an adjustment factor to account for the amount of correction deemed necessary to correct for the worst AGC error. Accordingly, the output of the clipper 404 is zero when the TX_lim signal 224 has a larger amplitude than the detected pre-amp output signal 221. Further, the output value of the clipper 404 is equal to the amplitude difference between the detected pre-amp output signal 221 and the TX_lim signal 224 multiplied by an adjustment factor when the pre-amp output signal 221 is larger than the TX_lim signal 224. The adjustment factor is used for scaling purposes to compensate for the sensitivity of the various components that are used. Without the clipper 404, the power limit control block 242 would force the transmitter 152 to run at maximum power irrespective of the value of the AGC signal 222. The integrator 406 then integrates the clipped power error signal to provide an integrated power error signal (to achieve zero residual error in the transmitted power when the power limit control block 207 settles). The integrator 406 can be implemented in hardware or software.

The power limiting transfer function 408 has a linear term and a first-order derivative term. The power limiting transfer function 408 processes the integrated power error signal to detect an over power condition before it occurs. During rapid ramp-up of the output power, the power control loop, including the switching regulator control block 208 and the switched mode power supply 210, may not respond quickly enough on its own. When a large rate of change of integrated error is detected, one can assume that the limit has been exceeded and the output signal needs to be clamped quickly. This functionality is provided by the various blocks in the power limit control block 207 including the power limiting transfer function 408. The power limiting transfer function 408 is chosen to get the desired transient performance of the power limit control block 207. The power limiting transfer function 408 also compensates for the behavior of the pre-amplifier 214 and other delays in the transmitter 152. This can be done by applying prior knowledge of the different shaped power ramps to the control of the transmission power limit. The term "power ramp" refers to the relationship between power and time that is used to transition between different power levels. The knowledge of the desired shape, i.e. time response, allows for a more accurate design of the power limiting transfer function.

When the transmitter power limit TX_lim is exceeded, the error signal 412 is subtracted from the modified AGC signal 223 by the summer 410 to produce the gain control signal 230 to control the gain of the pre-amplifier 214. Alternatively, if the power limit TX_lim is not exceeded, the error signal has a value of 0 and the gain control signal 230 is the modified AGC signal 223. The modified AGC signal 223 is generated by subtracting the output of the compensating control block 212 from the AGC signal 222.

The power limiting transfer function 408 can be generated by selecting various values for the detected signal 221, thereby testing various levels of over power with respect to the value of the transmit power control signal TX_lim 224, and selecting values for the transfer function such that the level of the error signal 412 is adjusted so that the gain control signal 230 results in an acceptable level of input drive provided by the output of the pre-amplifier 214. This sets the steady state characteristics of the power limiting transfer function 408. The transient characteristics of the power limiting transfer function 408 are then observed by looking at the step response of the power limiting transfer function 408. The values of the power limiting transfer function 408 are then adjusted so that the overshoot and the settling time of the step response are acceptable. In designs that include the switching control loop, the compensating loop, and the power limiting loop, the switching control transfer function and the compensating transfer function are selected and tuned first before tuning the power limiting transfer function.

Calibration difficulties come from the gain variation of the power amplifier 216 when the magnitude of the supply voltage signal 232 is changed. As the magnitude of the supply voltage signal 232 is increased, the gain of the power amplifier 216 also increases. In previous control schemes, the supply voltage signal 232 was controlled as a function of the AGC signal 222. As the AGC signal 222 increases, the gain of the power amplifier 216 increases predictably but the output increases much more rapidly at certain points in the curve. This is due to the combined effect of increased pre-driver gain and the gain change in the power amplifier 216 due to the supply voltage signal 232. Accordingly, kinks in the control curve can be eliminated by applying additional compensation to the AGC signal 222 and providing the pre-amplifier 214 with a modified gain control signal 230.

The topology shown of the power management block 204 in FIG. 3 is designed to address the deficiencies in conventional switcher control schemes. The power management block 204 employs a compensating feedback loop to create a linear relationship between the AGC signal 222 and the power of the amplified transmission signal 227. The compensating feedback loop includes the compensating control block 212 and the summer 213. The compensating control block 212 is an estimator that samples the supply voltage signal 232 at the output of switched mode power supply 210 and translates the supply voltage signal 232 into a gain correction signal 234. The gain correction signal is then subtracted from the AGC signal 222 via the summer 213 to produce a modified gain control signal 223. The compensating feedback loop acts to null the ill effects introduced by varying the magnitude of the supply voltage signal 232 to the power amplifier 216.

A compensating transfer function can be used to translate a value for the supply voltage signal 232 to a value for the gain correction signal 234. First, the relationship between the gain and the supply voltage signal 232 for the power amplifier 216 is determined for several power amplifiers. Once an average relationship has been obtained it is inversed, taking into account some average characteristics of the pre-amplifier 214, such as the control slope of the pre-amplifier 214, to produce the compensating transfer function such that there is a linear relationship between the gain and the supply voltage signal 232. One characteristic of the pre-amplifier 214 to consider is the average gain versus control voltage curve. The thermal characteristics can be compensated for at top power by matching the characteristics of the detector and transmitter chain. Alternatively, another design which uses brute force software compensation may be used that has compensation for temperatures at all power levels. Once the compensating transfer function is selected, the transient properties are examined by looking at the step response to make sure that it falls within acceptable limits. In designs which use the switching control transfer function, the compensating transfer function is selected and tuned after the switching control transfer function has been selected and tuned. In designs which also use the power limiting transfer function, the parameters for the power limit control block 207 are set high to not have an effect on selecting and tuning the compensating transfer function.

The compensating transfer function may be implemented in software by a lookup table or in hardware using a hardware filter. When the compensating transfer function is realized via a lookup table, the supply voltage signal 232 and its rate of change is used to determine a value for the gain correction signal 234. The rate of change of the supply voltage signal 232 can be used to anticipate the state that the power amplifier 216 will be in next because it takes some time for the other circuits to adjust. In a more advanced design one can monitor other bias parameters.

When the compensating transfer function is realized with a filter, the Laplace transform is applied to the time response or impulse response that corresponds to the compensating transfer function, and the filter is then synthesized based on the poles and zeros that are generated by the Laplace transform operation. The selection of the compensating transfer function allows for compensation not only of static gain changes but also dynamic variation due to lags in the power management control and power amplification blocks 202 and 204. The compensating transfer function has a linear term and a first order derivative term.

The effect of the compensating feedback loop is to linearize the relationship between the power of the amplified transmission signal 227 and the AGC signal 222 for the transmitter 152. Another result is that the compensating feedback loop decreases or postpones saturation effects for this relationship. Also, separating the power limiting function from the compensating control function decreases the accuracy requirements of the compensating control block 212.

It should be noted that accurate, data rate independent power limiting is provided by the choice of the detector 203 and the way that the power limit control block 207 is tuned. As the peak to average power ratio changes, the observed output of the detector 203 varies if it is not a true RMS detector. The accuracy of the power limiting transfer function 408 will depend on detecting true RMS power. Also, some detectors will have a log output. With a log output, the top part of the scale is more compressed so fine control of the output power involves comparing increasingly smaller voltage differences. With a linear true RMS detector, the measurement is data rate independent and the top end of the scale is expanded. However, in some designs, a non-RMS detector can be used.

As with the switching control transfer function, the power limiting transfer function 408 and the compensating control transfer function can be implemented in hardware with a filter. Alternatively, these transfer functions may be implemented with software (i.e. as a look-up table).

By placing the detector 203 after the pre-amplifier 214 and before the power amplifier 216, it is possible to eliminate the isolator 209 and output coupler 211. In contrast, if the detector 203 was placed at the output of the power amplifier 216, the isolator 209 and/or output coupler 211 would be required to prevent reflected power from being sensed by the detector 203. Further, there would be power losses in the amplified transmission signal 227 due to the sampling done by the coupler 205 if it was placed at the output of the power amplifier 216.

The isolator 209 and the output coupler 211 can be removed since the reverse isolation of the power amplifier 216 prevents reflected power from reaching the detector 203. The reverse isolation of the power amplifier 216 is indicated by the $S_{12}$ parameter which is the ratio of the power at the input of the power amplifier 216 to the power at the output of the power amplifier 216 when no input signal is provided to the power amplifier 216 and power is injected at the output of the power amplifier 216. A good reverse isolation can be achieved by controlling the drain gate capacitance of the final gain stage of the power amplifier 216 (for FET power amplifiers) or the collector base capacitance of the final gain stage of the power amplifier 216 (for HBT power amplifiers).

The removal of the isolator 209 and the output coupler 211 results in a cost/space savings due to implementing the transmitter 152 with a reduced number of components. In addition, the removal of the isolator 209 and the output coupler 211 eliminates additional components where power may be diverted or dissipated between the power amplification block 204 and the antenna 156, which reduces the amount of power loss in the amplified transmission signal 227 before it reaches the antenna 156.

However, with removal of the isolator 209 and the output coupler 211, the power amplifier 216 must be matched to the duplexer 260 to prevent load-induced power changes (especially if the isolator 209 is removed). Reflected power at the output of the power amplifier 216 as a result of load shifts can cause the forward power to change by upsetting the operating point of the power amplifier 216. Also, the reflected power can sometimes disturb the input of the power amplifier 216 if the reverse isolation is poor. However, with good reverse isolation and matching to the duplexer 260, the isolator 209 and the output coupler 211 can be removed without incurring the usual maximum output power accuracy penalties.

It should be noted that the architecture of the power management block 202 along with the location of the detector 203 results in: 1) accurate, rate independent power limiting (due to a combination of the power limiting transfer function 408 and the detector choice resulting in an expanded upper range), 2) linearization of the AGC curve versus transmission power for the amplification block 204, and 3) almost constant power amplifier compression versus transmitter power. Further, each transfer function is tuned in an appropriate manner related to its functionality and the transfer functions used in the various blocks are different from one another.

The structure and method described herein allow for the operation of the power amplifier 216 in constant compression independent of the power of the transmitter 152. This results in: a) optimal power savings since the power amplifier 216 is provided with a minimum of supply voltage as described previously, and b) constant code domain performance. The architecture of the transmitter 152 also allows for lower losses between the power amplifier 216 and the antenna 156 without incurring power accuracy penalties.

The power management block 204 can be divided into three subcomponents: a switching regulator control loop, a compensating feedback loop and a power limiting feedback loop. The switching regulator control loop includes the coupler 205, the detector 203, the switching regulator control block 208, and the switched mode power supply 210. The compensating feedback loop includes the components of the switching regulator control loop as well as the compensating control block 212, and the summer 213 and receives inputs from the AGC control signal 222 and the TX_lim control signal 224. The power limiting feedback loop includes the coupler 205, the detector 203, and the power limit control block 207 and receives inputs from the output of the summer 213 and the TX_lim control signal 224.

In one aspect, at least one embodiment described herein provides a transmitter for a wireless communications device. The transmitter comprises a power amplification block comprising a pre-amplifier configured to amplify a transmission signal to produce a pre-amplified transmission signal; and a power amplifier coupled to the pre-amplifier and configured to amplify the pre-amplified transmission signal to produce an amplified transmission signal. The transmitter further comprises a detector coupled to the output of the pre-amplifier and configured to provide a detected pre-amp output signal; and a power management block. The power management block comprises a switching regulator control block configured to generate a switching supply control signal based on the detected pre-amp output signal; and a switched mode power supply coupled to the switching regulator control block and configured to generate a supply voltage signal based on the switching supply control signal and provide the supply voltage signal to the power amplifier.

In another aspect, at least one embodiment described herein provides a mobile communication device comprising a main processor configured to control the operation of the mobile communication device; and a communication subsystem connected to the main processor, the communication subsystem being configured to send and receive data. The communication subsystem comprises a power amplification block, a detector, and a power management block. The power amplification block comprises a pre-amplifier configured to amplify a transmission signal to produce a pre-amplified transmission signal; and a power amplifier coupled to the pre-amplifier and configured to amplify the pre-amplified transmission signal to produce an amplified transmission signal. The detector is coupled to the output of the pre-amplifier and configured to provide a detected pre-amp output signal. The power management block comprises a switching regulator control block configured to generate a switching supply control signal based on the detected pre-amp output signal; and a switched mode power supply coupled to the switching regulator control block and configured to generate a supply voltage signal based on the switching supply control signal and provide the supply voltage signal to the power amplifier.

In yet another aspect, at least one embodiment described herein provides a method of providing a switching supply control signal to a power amplification block of a transmitter, the power amplification block including a pre-amplifier and a power amplifier. The method comprises detecting the output of the pre-amplifier to provide a detected pre-amp output signal; generating a switching supply control signal based on the detected pre-amp output signal; and generating the supply voltage signal by providing the switching supply control signal to a switched mode power supply.

Various embodiments have been described herein by way of example only. Various modification and variations may be made to these embodiments without departing from the spirit and scope of these embodiments, which is defined by the appended claims.

The invention claimed is:

1. A control system for a transmitter of a wireless device, the transmitter having a pre-amplifier and a power amplifier coupled to an output of the pre-amplifier, the control system comprising:
a signal input for receiving a detection signal representative of a pre-amplified transmission signal sensed at the output of the pre-amplifier by a detector;
a switching regulator control block configured to generate a switching supply control signal based on the received detection signal, the switching supply control signal comprising control values for a switched mode power supply configured to generate a supply voltage signal for the power amplifier in response to the switching supply control signal;
a power limit control block configured to generate a gain control signal based on an automatic gain control signal related to the pre-amplifier, the received detection signal, and a transmit power limit signal for limiting transmission power of the transmitter, the gain control signal being provided to the pre-amplifier for controlling gain in the pre-amplifier; and
a signal output for providing the switching supply control signal to the switched mode power supply;
wherein, in operation, the switching regulator control block communicates with the detector using the signal input and with the switched mode power supply using the signal output.

2. The control system of claim 1, wherein the switching regulator control block is configured to generate the switching supply control signal by applying a switching control transfer function to the received detection signal, the switching control transfer function having values determined based on a characterization of the response of the detector, control curves of the switched mode power supply, and a response of the power amplifier to input drive.

3. The control system of claim 2, wherein the switching regulator control block is configured to generate the switching supply control signal further based on a trim signal generated to compensate for component tolerances.

4. The control system of claim 1, wherein the switching regulator control block is implemented with a processor and the switching control transfer function is defined using one or more look-up tables.

5. The control system of claim 1, wherein the power limit control block is implemented with a processor and is configured to apply a power limiting transfer function defined using one or more look-up tables to generate the gain control signal.

6. The control system of claim 1, wherein the control values for the switched mode power supply are generated to hold the power amplifier in a state of constant compression.

7. The control system of claim 1, wherein the power management block further comprises a compensation control block configured to provide a gain correction signal based on the supply voltage signal, and wherein the gain correction signal is subtracted from the automatic gain control prior to providing the automatic gain control signal to the power limit control block.

8. A method of controlling a transmitter of a wireless device, the transmitter having a pre-amplifier and a power amplifier coupled to an output of the pre-amplifier, the method comprising:
receiving a detection signal representative of a pre-amplified transmission signal sensed at the output of the pre-amplifier by a detector;
generating a switching supply control signal based on the received detection signal, the switching supply control signal comprising control values for a switched mode power supply configured to generate a supply voltage signal for the power amplifier in response to the switching supply control signal;
generating a gain control signal based on an automatic gain control signal related to the pre-amplifier, the received detection signal, and a transmit power limit signal for limiting transmission power of the transmitter, the gain control signal being provided to the pre-amplifier for controlling gain in the pre-amplifier; and
providing the switching supply control signal to the switched mode power supply.

9. The method of claim 8, further comprising generating the switching supply control signal by applying a switching control transfer function to the received detection signal, the switching control transfer function having values determined based on a characterization of the response of the detector, control curves of the switched mode power supply, and a response of the power amplifier to input drive.

10. The method of claim 9, further comprising generating the switching supply control signal based on a trim signal generated to compensate for component tolerances.

11. The method of claim 8, wherein the switching supply control signal is generated by a processor and the switching control transfer function is defined in using one or more look-up tables.

12. The method of claim 8, wherein the gain control signal is generated by a processor, and the method further comprises applying a power limiting transfer function using one or more look-up tables to generate the gain control signal.

13. The method of claim 8, further comprising generating the control values for the switched mode power supply to hold the power amplifier in a state of constant compression.

14. The method of claim 8, further comprising generating a gain correction signal based on the supply voltage signal, and wherein the gain correction signal is subtracted from the automatic gain control signal prior to generating the gain control signal.

15. A non-transitory computer-readable storage medium storing instructions executable by a processor coupled to the storage medium, the instructions, when executed by the processor, cause the processor to perform acts of a method of controlling a transmitter of a wireless device, the transmitter having a pre-amplifier and a power amplifier coupled to an output of the pre-amplifier, said acts comprising:

receiving a detection signal representative of a pre-amplified transmission signal sensed at the output of the pre-amplifier by a detector;

generating a switching supply control signal based on the received detection signal, the switching supply control signal comprising control values for a switched mode power supply configured to generate a supply voltage signal for the power amplifier in response to the switching supply control signal;

generating a gain control signal based on an automatic gain control signal related to the pre-amplifier, the received detection signal, and a transmit power limit signal for limiting transmission power of the transmitter, the gain control signal being provided to the pre-amplifier for controlling gain in the pre-amplifier; and providing the switching supply control signal to the switched mode power supply.

16. The non-transitory computer-readable storage medium of claim 15, wherein said acts further comprise generating the switching supply control signal by applying a switching control transfer function to the received detection signal, the switching control transfer function having values determined based on a characterization of the response of the detector, control curves of the switched mode power supply, and a response of the power amplifier to input drive.

17. The non-transitory computer-readable storage medium of claim 16, wherein said acts further comprise generating the switching supply control signal based on a trim signal generated to compensate for component tolerances.

18. The non-transitory computer-readable storage medium of claim 15, wherein said acts further comprise defining the switching control transfer function using one or more look-up tables.

19. The non-transitory computer-readable storage medium of claim 15, wherein said acts further comprise applying a power limiting transfer function using one or more look-up tables to generate the gain control signal.

20. The non-transitory computer-readable storage medium of claim 15, wherein said acts further comprise generating the control values for the switched mode power supply to hold the power amplifier in a state of constant compression.

21. The non-transitory computer-readable storage medium of claim 15, wherein said acts further comprise generating a gain correction signal based on the supply voltage signal, and wherein the gain correction signal is subtracted from the automatic gain control signal prior to generating the gain control signal.

* * * * *